United States Patent [19]

Passlack et al.

[11] Patent Number: 5,597,768

[45] Date of Patent: Jan. 28, 1997

[54] METHOD OF FORMING A $GA_2O_3$ DIELECTRIC LAYER

[75] Inventors: Matthias Passlack, Chandler; Jonathan K. Abrokwah, Tempe, both of Ariz.

[73] Assignee: Motorola, Inc., Schaumburg, Ill.

[21] Appl. No.: 619,400

[22] Filed: Mar. 21, 1996

[51] Int. Cl.[6] ............................................. H01L 21/316
[52] U.S. Cl. .............................. 437/236; 437/31; 437/40; 148/DIG. 118
[58] Field of Search ........................... 437/236, 22, 31, 437/40, 41, 129, 184; 148/DIG. 95, DIG. 65, DIG. 118

[56] References Cited

U.S. PATENT DOCUMENTS

| | | | |
|---|---|---|---|
| 4,859,253 | 8/1989 | Buchanan et al. | 148/333 |
| 5,451,548 | 9/1995 | Hunt et al. | 437/225 |
| 5,474,851 | 12/1995 | Ganswein | 428/432 |

*Primary Examiner*—R. Bruce Breneman
*Assistant Examiner*—Matthew Whipple
*Attorney, Agent, or Firm*—Eugene A. Parsons

[57] ABSTRACT

A method of forming a dielectric layer on a supporting structure of III-V material having a clean and atomically ordered surface to be coated with a dielectric layer including the step of depositing a layer of $Ga_2O_3$, having a sublimation temperature, on the surface of the supporting structure by evaporation using a high purity single crystal of material including $Ga_2O_3$ and a second oxide with a melting point greater than 700° C. above the sublimation temperature of the $Ga_2O_3$. The evaporation can be performed by any one of thermal evaporation, electron beam evaporation, and laser ablation.

14 Claims, 2 Drawing Sheets

5,597,768

METHOD OF FORMING A GA₂O₃ DIELECTRIC LAYER

FIELD OF THE INVENTION

The present invention pertains to methods of forming dielectric layers on supporting structures and more particularly to methods of forming dielectric layers with significantly lower defect densities.

BACKGROUND OF THE INVENTION

In the semiconductor art it is often desirable to form dielectric layers or films on various supporting structures, such as the gate insulator in field effect transistors, an insulator or passivation layer covering various areas (e.g. the extrinsic base region) of other types of transistors, such as HBTs and the like, an insulator or passivation layer surrounding the mesa or walls of a vertical cavity surface emitting laser or edge emitting lasers, etc. Regardless of the use, it is generally imperative that the dielectric layer or film be a good insulator with low defect density to enable device operation and enhance/maintain device performance.

Due to a lack of insulating layers on gallium arsenide (GaAs) based semiconductors providing low interface state density and stable device operation, the performance, integration level and marketability of both digital and analog GaAs based devices and circuits is significantly limited. As is known in the art, growing oxide films by oxidizing GaAs based materials results in high interface state density and a Fermi level which is pinned at the GaAs-oxide interface.

A method of forming a thin film of $Ga_2O_3$ is disclosed in U.S. Pat. No. 5,451,548, entitled "Electron Beam Deposition of Gallium Oxide Thin Films Using A Single Purity Crystal Source", issued Sep. 19, 1995. Basically, this method consists of forming the thin film of $Ga_2O_3$ from the electron beam evaporation of a single crystal of $Gd_3Ga_5O_{12}$. The $Gd_3Ga_5O_{12}$ decomposes into $Gd_2O_3$ (gadolinium oxide) and $Ga_2O_3$ (gallium oxide) during evaporation. The major problem is that some of the $Gd_2O_3$ (about 0.1% according to the patent) is incorporated into the thin film as impurities creating defects and increasing the bulk trap density. The increased defects and, inturn increased bulk trap density degrades the performance of the devices in which the thin film is used.

Accordingly, it would be highly desirable to provide a method of fabricating thin films with significantly reduced defect densities and, consequently, reduced bulk trap densities.

It is a purpose of the present invention to provide a new and improved method of fabricating thin dielectric layers or films.

It is another purpose of the present invention to provide a new and improved method of fabricating thin dielectric layers or films having substantially reduced defect and bulk trap densities.

It is a further purpose of the present invention to provide a new and improved method of fabricating thin dielectric layers or films which result in stable semiconductor device performance.

SUMMARY OF THE INVENTION

The above problems and others are at least partially solved and the above purposes and others are realized in a method of forming a dielectric layer on a supporting structure of III-V material having a surface to be coated with a dielectric layer including the step of depositing a layer of $Ga_2O_3$, having a sublimation temperature, on the surface of the supporting structure by evaporation using a high purity single crystal of material including $Ga_2O_3$ and a second oxide with a melting point greater than 700° C. above the sublimation temperature of the $Ga_2O_3$.

The evaporation can be performed by any one of thermal evaporation, electron beam evaporation, and laser ablation.

BRIEF DESCRIPTION OF THE DRAWINGS

Referring to the drawings.

DESCRIPTION OF THE PREFERRED EMBODIMENT

Figure 1:
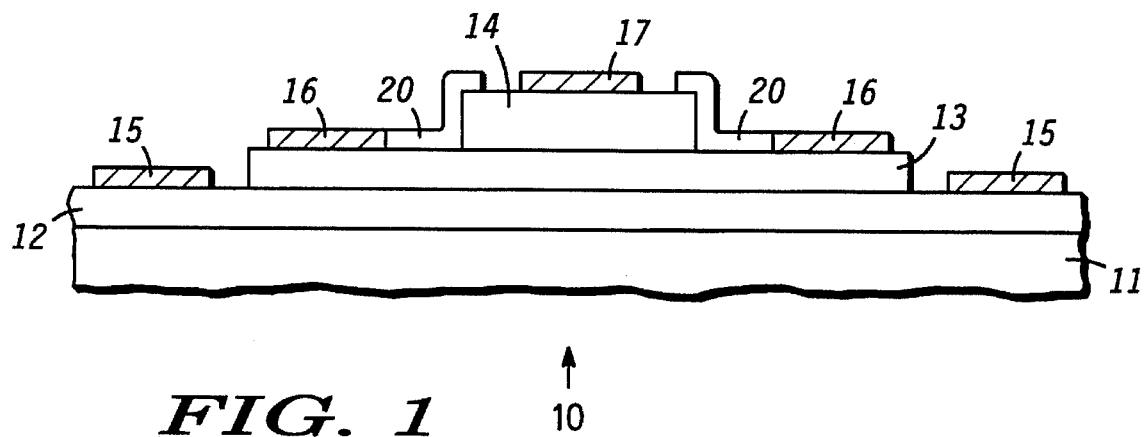
FIG. 1 is a simplified cross-sectional view of an HBT incorporating the present invention.

Referring specifically to FIG. 1 a simplified cross-sectional view of a heterojunction bipolar transistor (HBT) incorporating the present invention is illustrated. In this simplified form, HBT 10 includes a substrate 11, a collector layer 12 formed (grown or otherwise deposited) on the upper surface of substrate 11, a base layer 13 formed on the upper surface of collector layer 12 and an emitter layer 14 formed on the upper surface of base layer 13. Collector contact or contacts 15 are deposited on an upper surface of collector layer 12. Base contact or contacts 16 are deposited on an upper surface of base layer 13. An emitter contact 17 is deposited on an upper surface of emitter layer 14. All of the various layers and contacts are formed in a well known manner and may be formed in any sequence convenient to the specific device and fabrication technique being utilized.

In general, substrate 11 is a III-V material such as gallium arsenide and all of the materials used in layers 12, 13 and 14 are in a similar material system so as to be crystalographically coupled. This is accomplished, as is known in the art, by epitaxially growing the various layers in sequence in a standard growth chamber.

An oxide film 20 is formed over exposed portions of emitter layer 14 and base layer 13 for purposes of passivation and to enhance device performance and stability. As explained above, oxide film 20 may be formed at any convenient time during the fabrication process following removal of native oxide under ultra-high vacuum conditions. Oxide film 20 is formed by providing a high purity single crystal source of a specifically chosen material and evaporating the source by one of thermal evaporation, electron beam evaporation, and laser ablation. Also, oxide film 20 is generally formed with a thickness greater than 30 angstroms and preferably in a range of approximately 20 angstroms to 50 angstroms. The single crystal source is composed of $Ga_2O_3$ and a second oxide, which in the case of the above described patent is $Gd_2O_3$.

In general, oxide film 20 is formed utilizing processes similar to that described in the above patent, i.e. fabricating low interface state density ($10^{10}$ cm$^{-2}$eV$^{-1}$ range) insulator GaAs structures using in-situ deposition of $Ga_2O_3$ films on clean, atomically ordered (100) GaAs surfaces using a (multiple chamber) ultra-high vacuum system, at substrate temperatures ranging from 0° C. to 620° C. In the present process the source is replaced with a material including $Ga_2O_3$ and a second oxide with a melting point greater than 700° C. above the sublimation temperature of the $Ga_2O_3$. The sublimation temperature of $Ga_2O_3$ is 1710° C. to 1725° C. In a preferred method the high purity single crystal source is $MgGa_2O_4$ containing MgO and $Ga_2O_3$. The melting point of MgO is 2826° C. to 2852° C. Thus, the melting point of MgO is more than 1100° C. above the sublimation temperature of $Ga_2O_3$.

During heating, $MgGa_2O_4$ decomposes into MgO and $Ga_2O_3$. The $Ga_2O_3$ is slowly released eliminating splattering of the source material on the semiconductor structure. While MgO is an undesired by-product of the dissocition process, the much higher boiling point (or melting point) results in a significantly lower vapor pressure (approximately 10 orders of magnitude) of the MgO. This in turn results in drastically reduced incorporation of the undesired specie in the oxide film and in significantly lower bulk trap density in the oxide film.

While $MgGa_2O_4$ is a preferred source material, many other materials, including the gallates $BeGa_4O_7$, $Ca_3Ga_2O_6$ ($CaGa_2O_4$, $CaGa_4O_7$), and $SrGa_2O_4$, ($Sr_7Ga_4O_{13}$, $Sr_3Ga_2O_6$, $SrGa_4O_7$, $SrGa_{12}O_{19}$) are potential replacements. Each of the listed gallates decomposes into $Ga_2O_3$ and BeO, CaO, or SrO. The melting points of the second oxides is: BeO is 2530° C., CaO is 2614° C., and SrO is 2430° C. Thus, each of theses oxides has a much higher melting point resulting in a significantly lower vapor pressure and reduced impurities in the oxide film.

Figure 2:
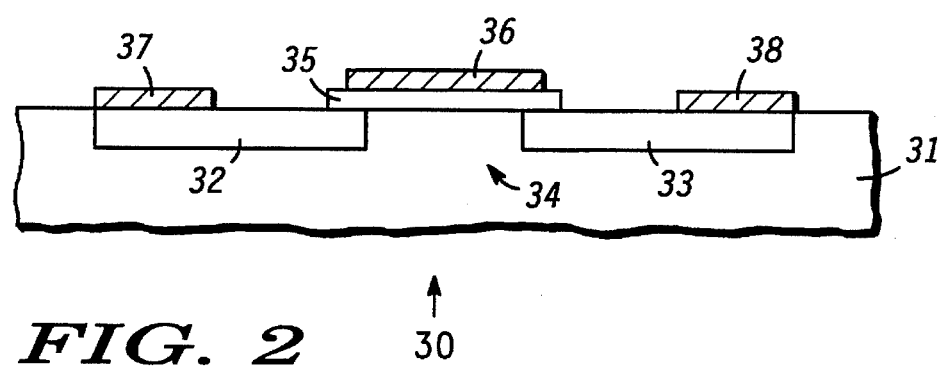
FIG. 2 is a simplified cross-sectional view of a metal-oxide semiconductor FET incorporating the present invention.

Referring now to FIG. 2, a simplified cross-sectional view of a semiconductor FET 30 is illustrated. FET 30 includes a substrate 31 having heavily doped source and drain areas 31 and 32, respectively, formed therein with a channel area 34 therebetween. Substrate 31 is a GaAs based material (III-V material). An oxide film 35 (generally referred to as a gate oxide) is deposited over channel area 34 in accordance with the present invention. A gate metal contact 36 is deposited on oxide film 35 in a usual procedure and source and drain contacts 37 and 38 are deposited on source and drain areas 31 and 32, respectively.

Figure 3:
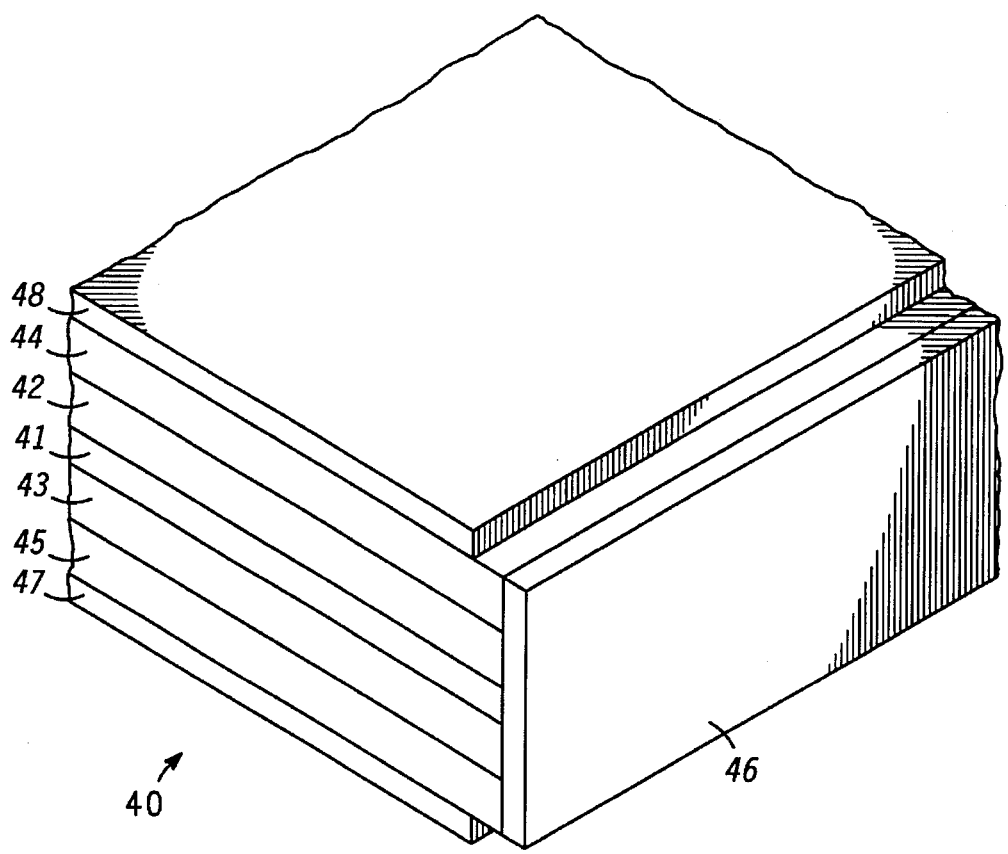
FIG. 3 is a simplified isometric view of a semiconductor laser incorporating the present invention.

Referring now to FIG. 3, a simplified isometric view of a semiconductor laser 40 is illustrated. In this embodiment, an active layer 41 containing at least one quantum well is sandwiched between optical confinement layers 42 and 43, which are in turn sandwiched between cladding layers 44 and 45. Strictly for illustrative purposes an oxide film 46 is deposited over a light emitting facet of the structure. Ohmic contacts are deposited on the outer surfaces of cladding layers 44 and 45 to provide power to the structure. As is well known in the art, layers 41–45 of various lasers are formed of GaAs based material (a III-V material).

Figure 4:
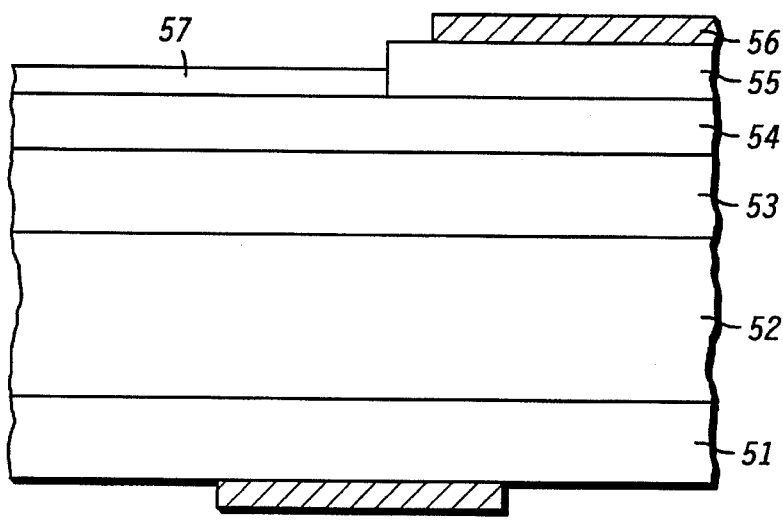
FIG. 4 is a simplified cross-sectional view of a light receiving semiconductor device incorporating the present invention.

Referring now to FIG. 4, a simplified cross-sectional view of a light receiving semiconductor device 50 incorporating the present invention is illustrated. Device 50 is basically a light sensitive P-N junction including a GaAs substrate 51 with $N^+$ doping and an ohmic contact on the lower surface. A drift region 52 is formed of a layer of GaAs with $N^-$ doping. A GaAs layer 53 with $P^+$ doping is formed on the surface of drift region 52 and a contact layer 54 of AlGaAs with $P^+$ doping is formed on the surface thereof. A GaAs layer 55 with $P^+$ doping partially covers layer 55 and has an ohmic contact 56 thereon. The remainder of layer 54 is covered with an oxide film 57, formed in accordance with the present invention, and defines a light receiving surface.

Thus, a new and improved method of forming a dielectric layer on III-V based materials, and specifically GaAs based materials, is disclosed. The improved process results in oxide films incorporating significantly lower impurities and trap density. The significantly lower trap densities result in the fabrication of stable high-performance semiconductor devices.

While we have shown and described specific embodiments of the present invention, further modifications and improvements will occur to those skilled in the art. We desire it to be understood, therefore, that this invention is not limited to the particular forms shown and we intend in the append claims to cover all modifications that do not depart from the spirit and scope of this invention.

What is claimed is:

1. A method of forming a dielectric layer on a supporting structure comprising the steps of:

provi ding a supporting structure of III-V material having a surface to be coated with a dielectric layer; and depositing a layer of $Ga_2O_3$ on the surface of the supporting structure by evaporation using a high purity single crystal $MgGa_3O_4$ source at substrate temperatures ranging from 0° C. to 620° C.

2. A method of forming a dielectric layer on a supporting structure as claimed in claim 1 wherein the layer of $Ga_2O_3$ is formed to a thickness equal to or greater than 30 Angstroms.

3. A method of forming a dielectric layer on a supporting structure as claimed in claim 1 wherein the layer of $Ga_2O_3$ is formed to a thickness in a preferred range of 20 angstroms to 50 Angstroms.

4. A method of forming a dielectric layer on a supporting structure as claimed in claim 1 wherein the step of depositing a layer of $Ga_2O_3$ on the surface of the supporting structure by evaporation includes one of thermal evaporation, electron beam evaporation, and laser ablation.

5. A method of forming a dielectric layer on a supporting structure as claimed in claim 1 wherein the step of providing a supporting structure includes providing a layer of GaAs.

6. A method of forming a dielectric layer on a supporting structure comprising the steps of:

providing a supporting structure of III-V material having a surface to be coated with a dielectric layer; and depositing a layer of $Ga_2O_3$, having a sublimation temperature, on the surface of the supporting structure by evaporation using a high purity single crystal of material including $Ga_2O_3$ and a second oxide with a melting point greater than 700° C. above the sublimation temperature of the $Ga_2O_3$.

7. A method of forming a dielectric layer on a supporting structure as claimed in claim 6 wherein the step of depositing is performed at substrate temperatures ranging from 0° C. to 620° C.

8. A method of forming a dielectric layer on a supporting structure as claimed in claim 6 where, in the step of depositing, the high purity single crystal of material the second oxide preferably has a melting point greater than 800° C. above the sublimation temperature of the $Ga_2O_3$.

9. A method of forming a dielectric layer on a supporting structure as claimed in claim 6 wherein the layer of $Ga_2O_3$ is formed to a thickness equal to or greater than 20 angstroms.

10. A method of forming a dielectric layer on a supporting structure as claimed in claim 9 wherein the layer of $Ga_2O_3$ is formed to a thickness in a preferred range of 20 angstroms to 50 angstroms.

11. A method of forming a dielectric layer on a supporting structure as claimed in claim 6 wherein the step of depositing a layer of $Ga_2O_3$ on the surface of the supporting structure by evaporation includes one of thermal evaporation, electron beam evaporation, and laser ablation.

12. A method of forming a dielectric layer on a supporting structure as claimed in claim 6 wherein the step of providing a supporting structure includes providing a layer of GaAs.

13. A method of forming a stable semiconductor device comprising the steps of:

provident an at least partially completed semiconductor device including supporting structure of III-V material having a surface to be coated with a dielectric layer; and depositing a layer of $Ga_2O_3$, having a sublimation temperature, on the surface of the supporting structure by evaporation using a high purity single crystal of material including $Ga_2O_3$ and a second oxide with a melting point greater than 700° C. above the sublimation temperature of the $Ga_2O_3$.

14. A method of forming a stable semiconductor device as claimed in claim 13 wherein the step of providing the at least partially completed semiconductor device includes providing one of a metal-oxide field effect transistor, an HBT, and a semiconductor laser.

\* \* \* \* \*